(12) United States Patent
Johnson et al.

(10) Patent No.: US 7,206,956 B2
(45) Date of Patent: *Apr. 17, 2007

(54) DUTY CYCLE DISTORTION COMPENSATION FOR THE DATA OUTPUT OF A MEMORY DEVICE

(75) Inventors: James B. Johnson, Boise, ID (US); Feng D. Lin, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/351,277

(22) Filed: Feb. 8, 2006

(65) Prior Publication Data

US 2006/0195713 A1    Aug. 31, 2006

Related U.S. Application Data

(63) Continuation of application No. 11/018,810, filed on Dec. 21, 2004, now Pat. No. 7,028,208, which is a continuation of application No. 09/809,608, filed on Mar. 15, 2001, now Pat. No. 6,895,522.

(51) Int. Cl.
  *G06F 1/12* (2006.01)
  *G06F 13/42* (2006.01)
  *H03L 7/06* (2006.01)
  *G11C 8/00* (2006.01)

(52) U.S. Cl. .............. 713/401; 713/400; 713/500; 713/501; 327/158; 327/159; 365/233

(58) Field of Classification Search .............. None
See application file for complete search history.

(56) References Cited

U.S. PATENT DOCUMENTS

| 5,614,855 A | 3/1997 | Lee |
| 6,003,118 A | 12/1999 | Chen |
| 6,016,282 A | 1/2000 | Keeth |
| 6,321,282 B1 * | 11/2001 | Horowitz et al. ........... 710/104 |

(Continued)

FOREIGN PATENT DOCUMENTS

JP    411186903 A    7/1999

OTHER PUBLICATIONS

Hamamoto, T; Kawasaki, S.; Furutani, K.; Yasuda, K.; Konishi, Y.; A skew and jitter suppressed DLL architecture for high frequency DDR SDRAMs, VLSI Circuits, 2000. Digest of Technical Papers. 2000 Symposium on, Jun. 15-17, 2000, pp. 76 and 77.

*Primary Examiner*—James K. Trujillo
(74) *Attorney, Agent, or Firm*—Fletcher Yoder, PC

(57) ABSTRACT

A technique for compensating for duty cycle distortion in an output data signal generated by a synchronous dynamic random access memory device (SDRAM) is provided. The output latch of the SDRAM is driven by an output clock signal generated by a delay lock loop (DLL). The output clock signal is phase-shifted relative to a reference clock signal received by the DLL such that the data removed from the output latch is synchronous with the reference clock signal. Further the duty cycle of the output clock signal is adjusted in a phase inverse relationship to the duty cycle distortion introduced by the output latch. As a result, the output data signal has reduced duty cycle distortion.

20 Claims, 6 Drawing Sheets

U.S. PATENT DOCUMENTS

| | | |
|---|---|---|
| 6,323,705 B1 | 11/2001 | Shieh et al. |
| 6,452,432 B2 | 9/2002 | Kim |
| 6,580,305 B1 * | 6/2003 | Liu et al. .................... 327/298 |
| 6,584,021 B2 | 6/2003 | Heyne et al. |
| 6,718,477 B1 | 4/2004 | Plants et al. |
| 6,763,477 B1 | 7/2004 | McGee |
| 2001/0029566 A1 * | 10/2001 | Shin ........................... 713/320 |

* cited by examiner

DUTY CYCLE DISTORTION COMPENSATION FOR THE DATA OUTPUT OF A MEMORY DEVICE

CROSS-REFERENCE TO RELATED APPLICATIONS

This application is a continuation of U.S. application Ser. No. 11/018,818, filed on Dec. 21, 2004, now U.S. Pat. No. 7,028,208, which is a continuation of U.S. application Ser. No. 09/809,608, filed on Mar. 15, 2001, which issued on May 17, 2005, as U.S. Pat. No. 6,895,522.

BACKGROUND OF THE INVENTION

1. Field of the Invention

The present invention relates generally to memory devices and, more particularly, to a duty cycle distortion compensation scheme for the output data of a memory device, such as a double-data rate (DDR) dynamic random access memory (DRAM) device.

2. Description of the Related Art

This section is intended to introduce the reader to various aspects of art which may be related to various aspects of the present invention which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Microprocessor-controlled integrated circuits are used in a wide variety of applications. Such applications include personal computers, vehicle control systems, telephone networks, and a host of consumer products. As is well known, microprocessors are essentially generic devices that perform specific functions under the control of a software program. This program is stored in a memory device which is coupled to the microprocessor. Not only does the microprocessor access memory devices to retrieve the program instructions, but it also stores and retrieves data created during execution of the program in one or more memory devices.

There are a variety of different memory devices available for use in microprocessor-based systems. The type of memory device chosen for a specific function within a microprocessor-based system generally depends upon which features of the memory are best suited to perform the particular function. Memory manufacturers provide an array of innovative fast memory chips for various applications, including Dynamic Random Access Memories (DRAM), which are lower in cost but have slower data rates, and Static Random Access Memories (SRAM), which are more costly but offer higher data rates. Although both DRAMs and SRAMs are making significant gains in speed and bandwidth, even the fastest memory devices cannot match the speed requirements of most microprocessors. Regardless of the type of memory, the solution for providing adequate memory bandwidth depends on system architecture, the application requirements, and the processor, all of which help determine the best memory type for a given application. Limitations on speed include delays in the chip, the package, and the system. Thus, significant research and development has been devoted to finding faster ways to access memory and to reduce or hide latency associated with memory accesses.

Because microprocessor technology enables current microprocessors to operate faster than current memory devices, circuit techniques for increasing the speed of memory devices are often implemented. For example, one type of memory device, which can contribute to increased processing speeds in the computer system, is a Synchronous Dynamic Random Access Memory (SDRAM). An SDRAM differs from a standard DRAM in that the SDRAM includes input and output latches to hold information from and for the processor under control (i.e., synchronous with) the system clock. Because input information (i.e., addresses, data, and controls signals) is latched, the processor may safely perform other tasks while waiting for the SDRAM to finish its task, thereby reducing processor wait states. After a predetermined number of clock cycles during which the SDRAM is processing the processor's request, the processor may return to the SDRAM and obtain the requested information from the output latches.

A technique for increasing the speed of an SDRAM is to implement a Double Data Rate (DDR) SDRAM. In a Double Data Rate (DDR) memory device, the data transfer rate is twice that of a regular memory device, because the DDR's input/output data can be strobed twice for every clock cycle. That is, data is sent on both the rising and falling edges of the clock signal rather than just the rising edge of the clock signal as in typical Single Data Rate (SDR) systems.

As data rates are increased to meet the demands of today's high-speed processing systems, distortion in the data output caused by the switching of components within the memory device may become more significant. Duty cycle distortion caused by the data output registers and latches of the data output of a DDR DRAM can be particularly problematic as data rates increase. Because data is read from the DDR DRAM on both the rising and falling edges of the clock signal, two data output windows (or "eyes") during which valid data may be read at the output pin of the DRAM occur for each cycle of the clock. If the data output latch distorts the duty cycle of the output data, the size of the windows during which data is valid may be significantly reduced, thus potentially leading to loss of data or reading of incorrect data as data rates increase.

Such duty cycle distortion may result from differences in processing parameters and other processing variations which occur with respect to the different types of components in the output latches and drivers. Additional factors, such as ambient temperature and voltage variations also contribute to duty cycle distortion. As a result, differences in slew rates between p- and n-channel output devices, differences in the mobility of holes in p-channel devices and the mobility of electrons in n-channel devices, variations in voltage levels applied to the various devices, and so forth, all can contribute to significant data duty cycle distortion. Processing variations may be compensated by post-production tuning to adjust for the differences between the p- and n-channel devices. Such a solution, however, is time-consuming and must be performed separately for each memory device, and cannot compensate for differences, such as ambient temperature and voltage variations, that may occur during actual operation of the device.

Thus, it would be desirable to provide a memory device having a circuit which actively compensates for output data duty-cycle distortion during operation of the memory device. Such a circuit could eliminate or reduce post-production tuning, while potentially more accurately responding to and compensating for the duty-cycle distortion caused by the output latch of the memory device.

The present invention thus may address one or more of the problems set forth above.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

One or more specific embodiments of the present invention will be described below. In an effort to provide a concise description of these embodiments, not all features of an actual implementation may be described in the specification. It should be appreciated that in the development of any such actual implementation, as in any engineering or design project, numerous implementation-specific decisions are made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
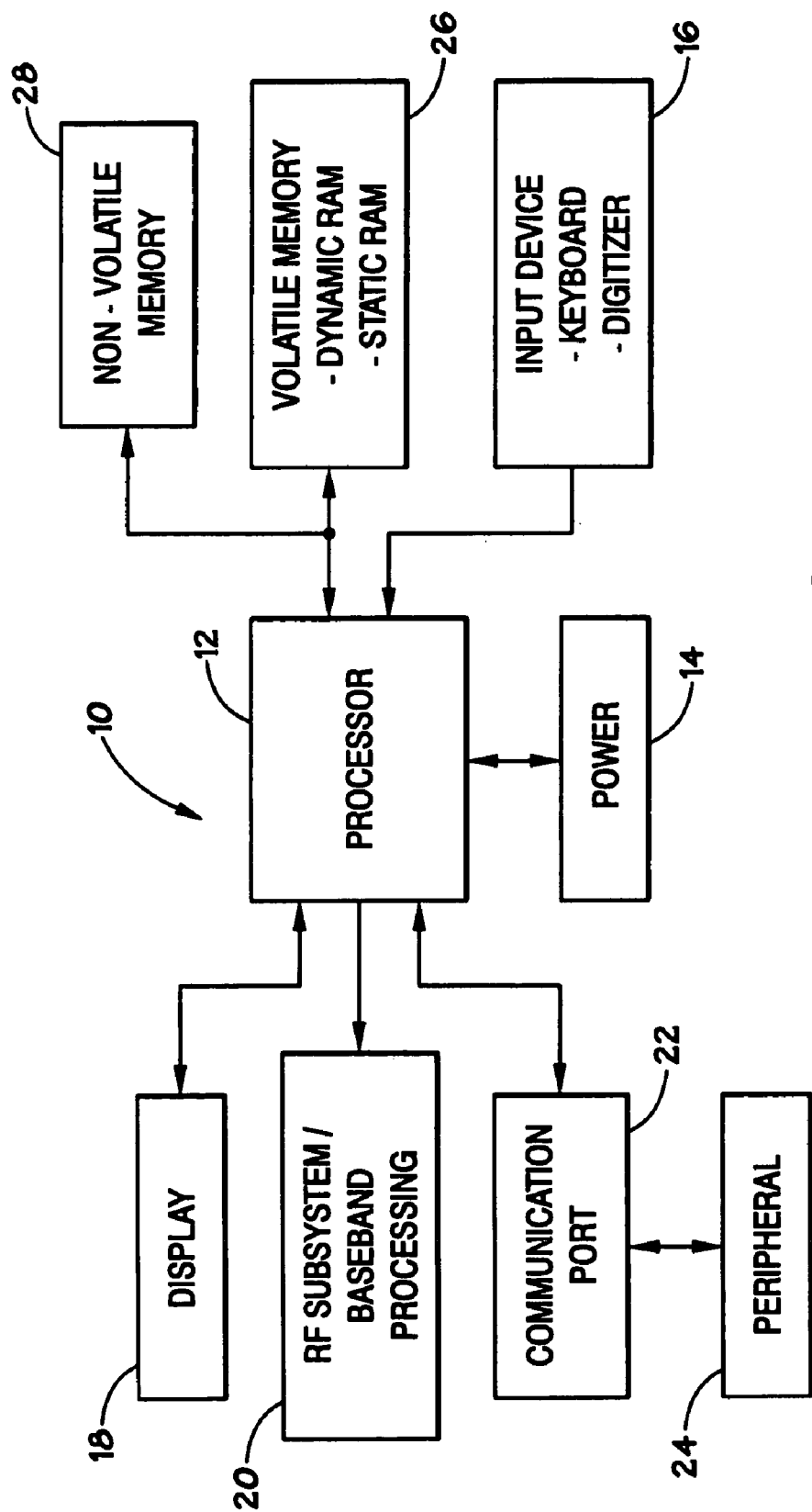
FIG. 1 illustrates a block diagram of an exemplary processor-based device in accordance with the present technique.

Turning now to the drawings, and referring initially to FIG. 1, a block diagram depicting an exemplary processor-based device, generally designated by the reference numeral 10, is illustrated. The device 10 may be any of a variety of different types, such as a computer, pager, cellular telephone, personal organizer, control circuit, etc. In a typical processor-based device, a processor 12, such as a microprocessor, controls many of the functions of the device 10.

The device 10 typically includes a power supply 14. For instance, if the device 10 is portable, the power supply 14 would advantageously include permanent batteries, replaceable batteries, and/or rechargeable batteries. The power supply 14 may also include an A/C adapter, so that the device may be plugged into a wall outlet, for instance. In fact, the power supply 14 may also include a D/C adapter, so that the device 10 may be plugged into a vehicle's cigarette lighter, for instance.

Various other devices may be coupled to the processor 12, depending upon the functions that the device 10 performs. For instance, a user interface 16 may be coupled to the processor 12. The user interface 16 may include an input device, such as buttons, switches, a keyboard, a light pin, a mouse, and/or a voice recognition system, for instance. A display 18 may also be coupled to the processor 12. The display 18 may include an LCD display, a CRT, LEDs, and/or an audio display. Furthermore, an RF subsystem/baseband processor 20 may also be coupled to the processor 12. The RF subsystem/baseband processor 20 may include an antenna that is coupled to an RF receiver and to an RF transmitter (not shown). A communication port 22 may also be coupled to the processor 12. The communication port 22 may be adapted to be coupled to a peripheral device 24, such as a modem, a printer, or a computer, for instance, or to a network, such as a local area network or the Internet.

Because the processor 12 controls the functioning of the device 10 generally under the control of software programming, memory is coupled to the processor 12 to store and facilitate execution of the software program. For instance, the processor 12 may be coupled to volatile memory 26, which may include dynamic random access memory (DRAM), static random access memory (SRAM), Double Data Rate (DDR) memory, etc. The processor 12 may also be coupled to non-volatile memory 28. The non-volatile memory 28 may include a read only memory (ROM), such as an EPROM or Flash Memory, to be used in conjunction with the volatile memory. The size of the ROM is typically selected to be just large enough to store any necessary operating system, application programs, and fixed data. The volatile memory, on the other hand, is typically quite large so that it can store dynamically loaded applications. Additionally, the non-volatile memory 28 may include a high capacity memory such as a disk drive, tape drive memory, CD ROM drive, DVD, read/write CD ROM drive, and/or a floppy disk drive.

The volatile memory 26 may include a number of SDRAMs which implement DDR technology. As mentioned previously, the SDRAM differs from a DRAM in that the SDRAM is controlled synchronously with a timing source, such as the system clock. To accomplish synchronous control, latches are used to provide data and other information on the inputs and outputs of the SDRAM. Thus, for example, for a read operation, the processor may visit a data output latch a predetermined number of clock cycles after issuing the read request. The predetermined number of clock cycles corresponds to the amount of time needed to access the requested data, move the data to the output latch, and allow the data to stabilize. The data is clocked out of the output latch synchronous with the system clock which provides the timing source for the processor. Synchronization of the data read from the output latch with the system clock generally is implemented via a delay lock loop (DLL) circuit, as will be discussed in detail below. In general, the DLL locks the data output signal to the system clock by shifting the DLL output clock signal in time such that the data clocked out of the SDRAM by the DLL is generally aligned with the system clock. Thus, the DLL can compensate for timing delays introduced by various components in the SDRAM.

Write operations also are performed synchronous with a timing source, such as the system clock or other externally provided timing source. Thus, data may be clocked into an input latch and written to the memory array under control of a write clock provided from the external device which is performing the write operation. Delay lock loops also may be implemented to synchronize write data with the write clock.

Figure 2:
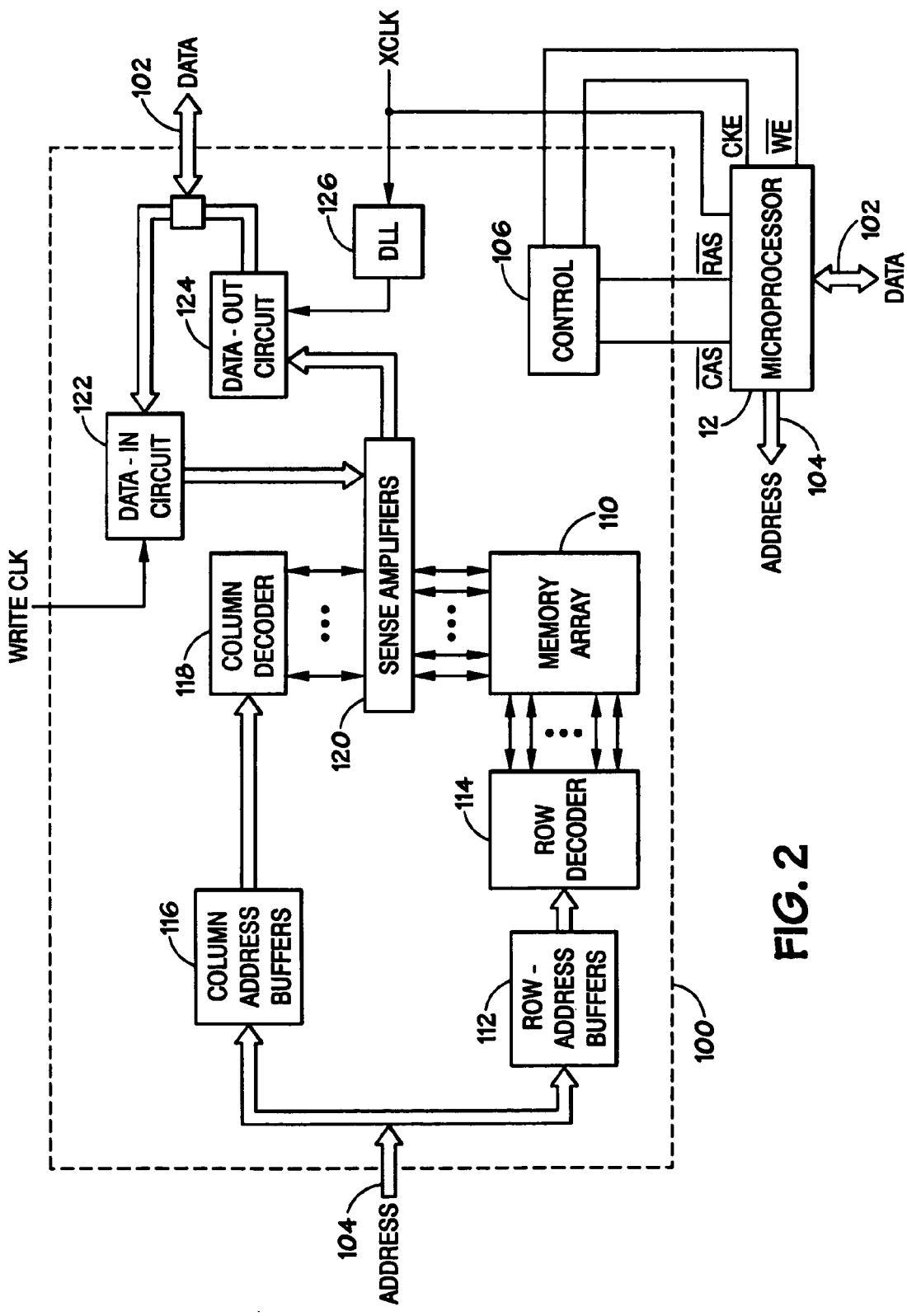
FIG. 2 illustrates a block diagram of an exemplary memory device used in the processor-based device of FIG. 1.

Turning now to FIG. 2, a block diagram depicting an exemplary embodiment of a DDR SDRAM is illustrated. The description of the DDR SDRAM 100 has been simplified for illustrative purposes and is not intended to be a complete description of all features of a DDR SDRAM. The present technique is not limited to DDR SDRAMs, and is equally applicable to other synchronous random access memory devices, and other devices for use in communication applications, such as double-edge triggered applications, which may benefit from strict adherence to timing. Those skilled in the art will recognize that a wide variety of memory devices may be used in the implementation of the present invention.

Control, address, and data information provided over a memory bus are represented by individual inputs to the DDR SDRAM 100. These individual representations are illustrated by a databus 102, address lines 104 and various discrete lines directed to control logic 106. As is known in the art, the SDRAM 100 includes a memory array 110 which comprises rows and columns of addressable memory cells. Each memory cell in a row is coupled to a word line. Additionally, each memory cell in a column is coupled to a bit line. Each cell in the memory array 110 typically includes a storage capacitor and an access transistor as is conventional in the art.

The SDRAM 100 interfaces with, for example, a microprocessor 12 through address lines 104 and data lines 102. Alternatively, the SDRAM 100 may interface with a SDRAM controller, a microcontroller, a chip set, or other electronic system. The microprocessor 12 also may provide a number of control signals to the SDRAM 100. Such signals may include row and column address strobe signals RAS/ and CAS/, a write enable signal WE/, a clock enable signal CKE, and other conventional control signals. The control logic 106 controls the many available functions of the SDRAM 100. In addition, various other control circuits and signals not detailed herein contribute to the SDRAM 100 operation as known to of ordinary skill in the art.

A row address buffer 112 and a row decoder 114 receive and decode row addresses from row address signals provided on the address lines 104. Each unique row address corresponds to a row of cells in the memory array 110. The row decoder 114 typically includes a word line driver, an address decoder tree, and circuitry which translates a given row address received from row address buffers 112 and selectively activates the appropriate word line of the memory array 110 via the word line drivers.

A column address buffer 116 and a column decoder 118 receive and decode column address signals provided on the address lines 104. The column decoder 118 also determines when a column is defective and the address of a replacement column. The column decoder 118 is coupled to sense amplifiers 120. The sense amplifiers 120 are coupled to complementary pairs of bit lines of the memory array 110.

The sense amplifiers 120 are coupled to data-in (i.e., write) circuitry 122 and data-out (i.e., read) circuitry 124. The data-in circuitry 122 and the data-out circuitry 124 include data drivers and latches, such as edge-triggered latches, edge-triggered flip-flops, and so forth, as will be discussed in detail below. During a write operation, the data bus 102 provides data to the data-in circuitry 122. The sense amplifier 120 receives data from the data-in circuitry 122 and stores the data in the memory array 110 as a charge on a capacitor of a cell at an address specified on the address line 104. In one embodiment, the data bus 102 is an 8-bit data bus carrying data at 400 MHz or higher.

During a read operation, the DDR SDRAM 100 transfers data to the microprocessor 12 from the memory array 110. Complementary bit lines for the accessed cell are equilibrated during a precharge operation to a reference voltage provided by an equilibration circuit and a reference voltage supply. The charge stored in the accessed cell is then shared with the associated bit lines. The sense amplifier 120 detects and amplifies a difference in voltage between the complementary bit lines. Address information received on address lines 104 selects a subset of the bit lines and couples them to complementary pairs of input/output (I/O) wires or lines. The I/O wires pass the amplified voltage signals to the data-out circuitry 124 and eventually out to the data bus 102.

Figure 3:
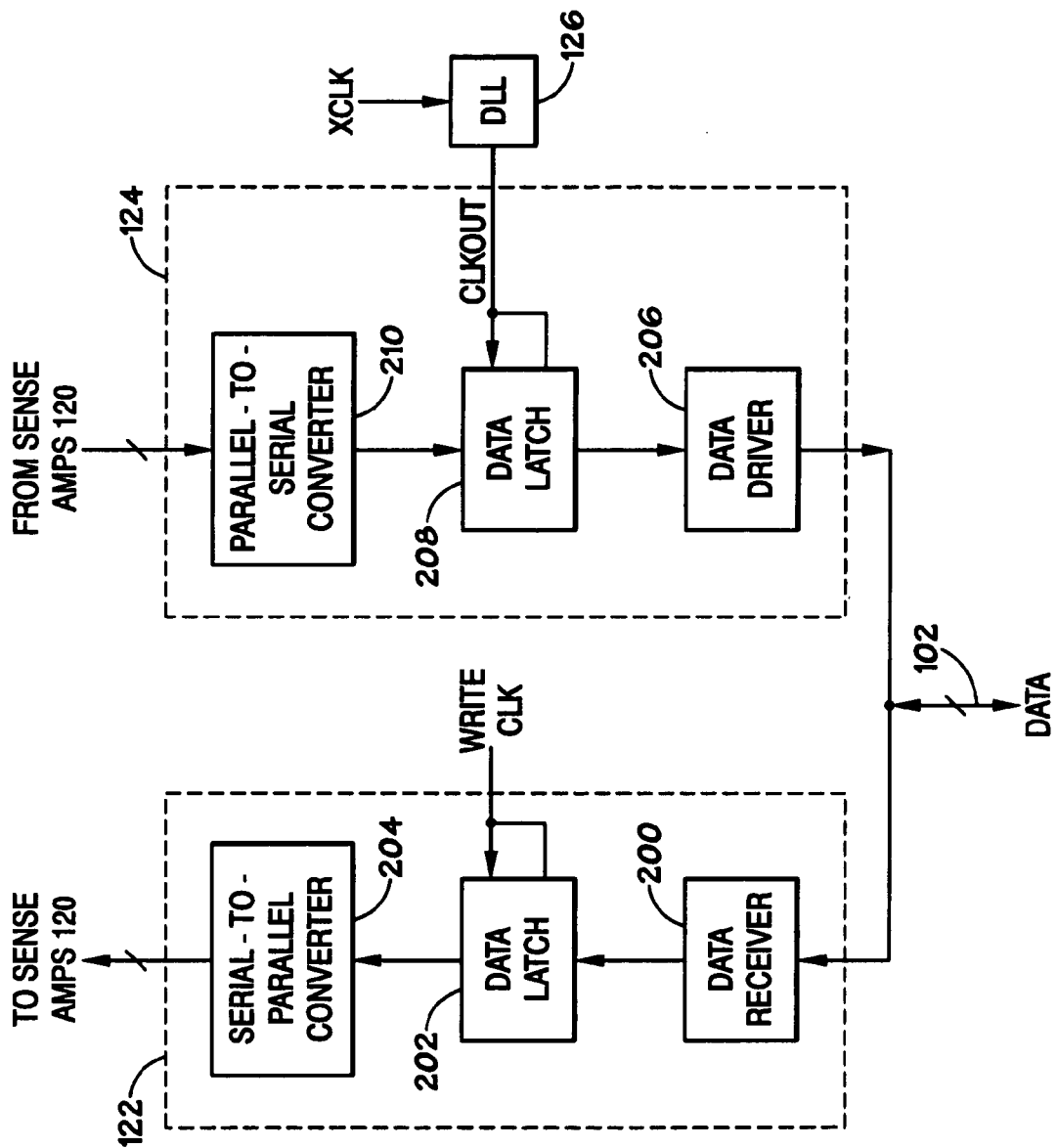
FIG. 3 illustrates a block diagram of exemplary output circuitry of the memory device of FIG. 2, including the output data latch and driver and a delay lock loop.

Turning now to FIG. 3, a block diagram of exemplary components in the data-in circuitry 122 and data-out circuitry 124 is illustrated. The data-in circuitry 122 includes a data receiver 200 to receive data from the data bus 102 to be written to the memory array 110, a data latch 202 to latch the write data as it is received via the data receiver 200, and a serial-to-parallel converter 204 to convert the data as it is taken from the data latch for issuance onto a wider bus. For example, in one embodiment, the data bus 102 may be a 8-bit bus, while the bus connecting the data-in circuitry 122 to the sense amplifiers 120 may be a 64-bit bus. As illustrated in FIG. 3, an external write clock (WRITE CLK) provides the timing source for the data latch 202.

Similar to the data-in circuitry 122, the data-out circuitry 124 includes a data driver 206 to drive data out onto the data bus 102 in response to a read request directed to the memory array 110, a data latch 208 to latch the read data until driven onto the data bus 102, and a parallel-to-serial converter 210 to convert the data read from the memory array 110 and transmitted on a wide bus (e.g., a 64-bit bus) to a narrower bus (e.g., a 8-bit bus). The timing source for the data latch 208 is provided by the DLL 126, which provides a shifted clock signal (CLKOUT) having an appropriate timing relationship with respect to the system clock (XCLK), such that the output data signal (DATA) on the data bus 102 is locked to, or synchronous with, the system clock. As discussed in detail below, the shifted clock signal CLKOUT also is distorted to compensate for the output data duty cycle distortion introduced by the data latch 208.

Figure 4:
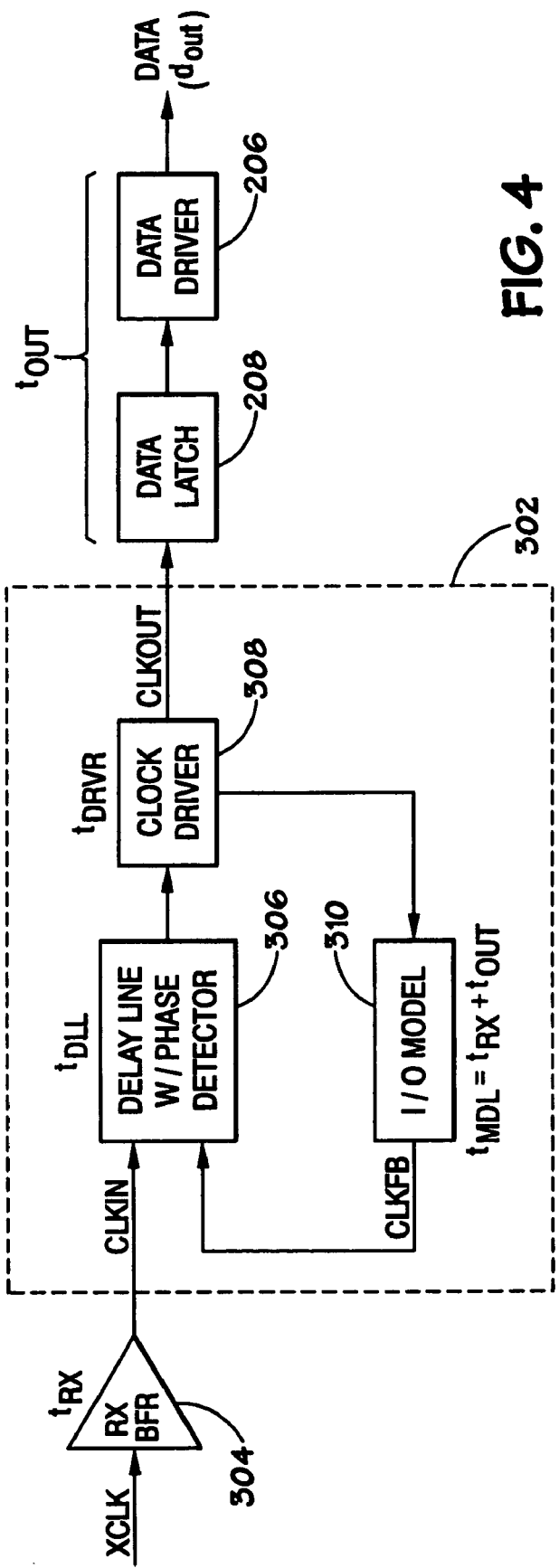
FIG. 4 illustrates a block diagram of a typical delay lock loop used to synchronize the output data from the memory device of FIG. 2 with the system clock.

An exemplary embodiment of a typical DLL 302 is illustrated in FIG. 4. The DLL 302 in FIG. 4 does not include duty cycle distortion compensation in accordance with the present technique, but is provided to facilitate the description of the operation of a DLL which synchronizes the data output signal to an external clock signal and to exemplify the resultant duty cycle distortion caused by the output data latch. In circuits having strict timing requirements, precise synchronization, or alignment, of signals with respect to a timing reference becomes an increasingly important function. Differences in alignment between signals having the same frequency may arise due to propagation delays inherent in each of the various components in the system through which the signal of interest passes as well as propagation delays caused by varying lengths of signal buses in the system. For example, it may be desirable to drive various components in the system with a reference clock signal generated by an external source and to obtain an output signal from the driven components which is synchronous with the reference clock signal. To reach the various components, the reference clock signal may be transmitted through various buffers and traverse buses of various lengths. Thus, when received at the input pin of a particular component, the clock signal no longer may be aligned (i.e., is out of phase) with the reference clock signal.

A conventional DLL, such as the DLL 302, implements synchronization by forcing at least one of the edges of the clock signal for the data latch 208 to have an appropriate timing relationship with respect to the reference clock signal XCLK, such that the data output signal (DATA) is in phase with the reference clock signal XCLK. The DLL 302 detects a phase difference between two signals and generates a corresponding control signal representative of the difference which is used to add or remove delay elements as needed to attain alignment of the data output signal (DATA) with the reference clock signal (XCLK).

In the DLL 302 illustrated in FIG. 4, a reference clock signal XCLK is received by a receiver buffer 304 and provided to a delay line/phase detector 306 as a buffered clock signal CLKIN. The output of the delay line/phase detector 306 is connected to a clock driver 308, which may have multiple outputs to distribute and drive buffered clock signals to multiple output data latches, such as the data latch 208, that may be physically located in different regions of an integrated circuit substrate. The clock driver 308 also generates an output clock signal which is provided to an input/output (I/O) model circuit 310.

The I/O model 310 provides a feedback (or control) clock signal CLKFB which is transmitted to the delay line/phase detector 306 for comparison with the buffered reference clock signal CLKIN. The phase detector 306 determines whether a difference exists between the feedback clock signal CLKFB and the buffered reference clock signal CLKIN. The detected difference determines the amount of delay to be added to or removed from the delay line 306 such that the buffered reference clock signal CLKIN may be shifted by an appropriate amount to produce an output clock signal CLKOUT that aligns, or locks, the data output signal DATA to the reference clock signal XCLK.

When the DLL 302 has locked the data output signal to the reference clock signal, then no difference should exist between the buffered clock signal CLKIN and the clock feedback signal CLKFB. This implies that the delay in the forward path of propagation of the reference clock signal XCLK to the output pin of the SDRAM (DATA) is equal to the delay in the feedback path of the DLL. Thus, if the delays in the forward path are expressed as follows:

$$d_{OUT}=t_{RX}+t_{DLL}+t_{DRVR}+t_{OUT}$$

where $d_{OUT}$ corresponds to the delay between the reference clock signal and the data output signal; $t_{RX}$ corresponds to the delay of the receiver buffer 304; $t_{DLL}$ corresponds to the delay in the delay line of the delay line/phase detector 306; $t_{DRVR}$ corresponds to the delay of the clock driver 308; and $t_{OUT}$ corresponds to the combined delay of the data latch 208 and the data driver 206;

and if the delays in the feedback path are expressed as:

$$d_{FBK}=t_{DLL}+t_{DRVR}+t_{MDL}$$

where tMDL corresponds to the delay of the I/O model 310; then, to achieve a phase lock, $$t_{MDL}=t_{RX}+t_{OUT}$$

Thus, the I/O model 310 introduces delays in the feedback path corresponding to the delay ($t_{RX}$) introduced by the receiver buffer 304 and the collective delay ($t_{OUT}$) introduced by the data latch 208 and the data driver 206.

The DLL 302 thus produces a clock signal CLKOUT to drive the data latch 208 such that the data output signal DATA is synchronous with the reference clock signal XCLK. Ideally, all edges of the data output signal should align with the edges of the clock signal. However, as discussed above, processing variations, ambient temperature variations, and voltage variations all may contribute to differences in the operation of the individual components in the output data latch 208 such that the data output signal DATA is distorted with respect to the clock signal XCLK. This natural distortion caused by the output circuit appears as duty cycle distortion in the data output signal DATA. As data output rates increase, the duty cycle distortion may become a significant factor in reducing the valid window for sampling the data at the output pin of the SDRAM, leading to inaccurate reading of data or potential data loss.

Figure 5:
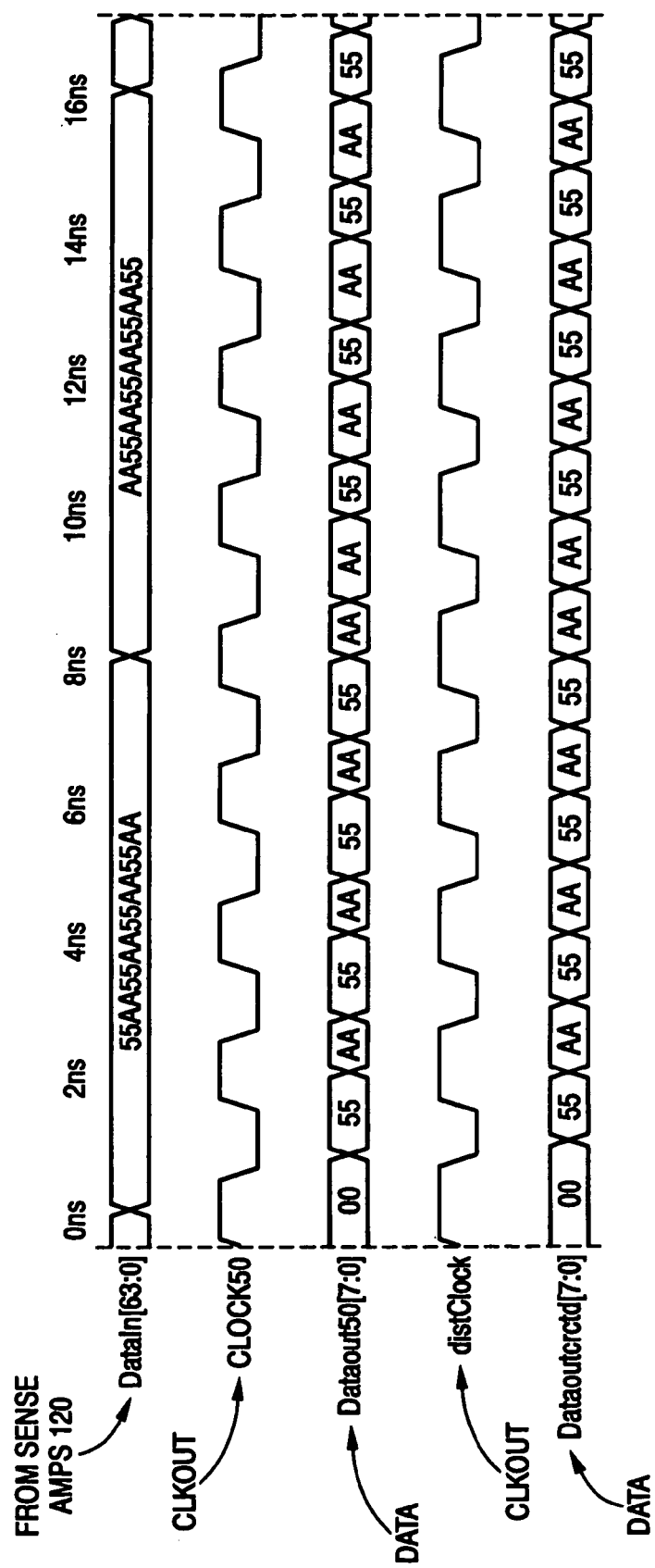
FIG. 5 is a timing diagram illustrating the distortion of the duty cycle of the output data signal when using the typical delay lock loop of FIG. 4, and the compensation of the output data duty cycle distortion by a memory device employing a duty cycle distortion compensation scheme, in accordance with the present technique.

An example of the duty cycle distortion caused by the data latch 208 when clocked by a typical DLL, such as the DLL 302, is provided by the waveforms illustrated in the graph of FIG. 5. The top line (DataIn[63:0]) of the FIG. 5 graph represents data read from the memory array 110 and provided to the data-out circuitry 124 via a 64-bit bus. The parallel-to-serial converter 210 converts the 64-bit data to 8-bit data for output onto an 8-bit data output bus 102. The next line of the graph (CLOCK50) represents an ideal output clock signal CLKOUT having a 50% duty cycle, which is provided by the DLL 302 to the data latch 208. When the data latch 208 is driven by the 50% duty cycle clock signal, the natural distortion of the latch 208 produces a distorted data output signal (DATA), which corresponds to the line in the graph labeled Dataout50[7:0]. As can be seen from the DATA waveform in FIG. 5, the window for reading data during one half of the clock cycle is significantly reduced with respect to the other half of the cycle. That is, the duty cycle of the output data signal is distorted.

If, however, the output clock signal CLKOUT from the DLL is distorted in a phase inverse relationship to the distortion caused by the latch 208, then duty cycle distortion compensation for the output data signal results. This type of compensation scheme is evident from the waveforms in FIG. 5, in which the CLKOUT waveform labeled distClock corresponds to an output clock signal that has been distorted in a phase inverse manner from the distortion evident in the Dataout50[7:0] DATA waveform. As a result, a DATA output signal (Dataoutcrctd[7:0]) having little or substantially reduced duty cycle distortion can be provided at the output pin of the SDRAM, as illustrated in the bottom waveform in FIG. 5.

Figure 6:
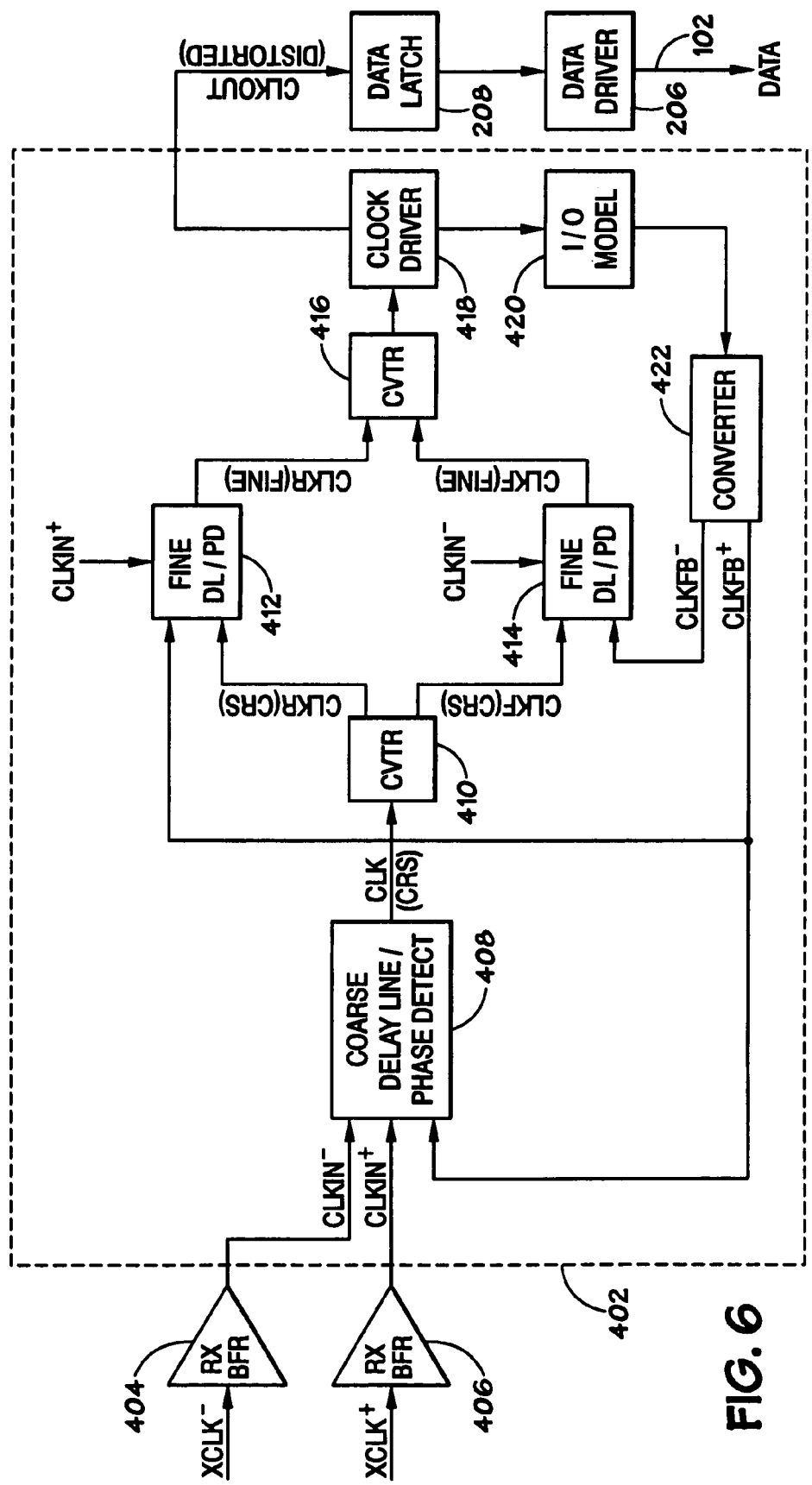
FIG. 6 illustrates a block diagram of an exemplary embodiment of a delay lock loop including output data duty cycle distortion compensation components to produce the compensated data output signal illustrated in FIG. 5.

An exemplary embodiment of a DLL 402 which includes duty cycle distortion compensation is illustrated in FIG. 6. The DLL 402 generates a CLKOUT signal having distortion that is phase inverted relative to the duty cycle distortion caused by the data latch 208. The DLL 402 implements such duty cycle distortion compensation by including a model of the output data latch 208, and thus the data latch distortion, in the I/O model in the feedback path, and by providing circuitry to individually adjust the relative phases of the rising edges of the clock signal and the falling edges of the clock signal to produce the appropriately distorted CLKOUT signal.

In the embodiment illustrated in FIG. 6, the DLL 402 includes a two-step locking scheme implemented by a coarse adjustment circuit 408 and two fine adjustment circuits 412 and 414. By providing a two-step locking scheme, delays in attaining a lock are reduced without sacrificing the ability to provide a delay adjustment range having sufficiently fine delay increments to adequately adjust the CLKOUT signal to compensate for the distortion of the output data latch 208. That is, the coarse adjustment circuit 408 is configured to quickly achieve a coarse lock, while the two fine adjustment circuits tune the rising and falling edges of the CLKOUT signal to compensate for the output data duty cycle distortion. It should be understood, however, that the DLL 402 may implement other types of locking schemes, such as a single-step locking scheme in which all adjustments are performed by a first delay line/phase detector for shifting rising edges and a second delay line/phase detector for shifting falling edges.

With reference to the two-step locking scheme illustrated in FIG. 6, the DLL 402 receives the reference clock signal XCLK via receiver buffers 404 and 406. In the exemplary embodiment illustrated, the reference clock signal is a differential signal represented by the references XCLK$^-$ and XCLK$^+$, which correspond to the falling edges and the rising edges of the reference clock signal XCLK, respectively. Similarly, the buffered differential input clock signal is represented by the references CLKIN$^-$ and CLKIN$^+$, which correspond to the falling edges and the rising edges of the buffered clock signal, respectively. The buffered clock signals CLKIN$^+$ and CLKIN$^-$ are provided to the input of a master, or coarse, adjustment circuit 408, which includes a delay line and a phase detector. The coarse adjustment circuit 408 compares the CLKIN$^+$ reference signal to the feedback signal CLKFB$^+$, detects the phase difference between the clock signal CLKIN$^+$ and the feedback signal CLKFB$^+$, and adds or reduces an appropriate delay in the delay line that will coarsely lock (i.e., align) the rising edge of the output data signal DATA to the rising edge of the reference signal XCLK$^+$. In an exemplary embodiment in which the reference clock signal XCLK has a frequency of 400 MHz, each delay element in the delay line of the coarse adjustment circuit 408 corresponds to a timing shift of approximately 200 picoseconds. However, it should be understood that the timing shift of each of the delay elements in the coarse adjustment circuit may be larger or smaller depending upon the particular operating parameters and the particular application in which the SDRAM is used.

The output of the coarse adjustment circuit 408 is a coarse clock signal CLK(CRS), which is provided to a converter 410. The converter 410 splits the CLK(CRS) signal into coarse rising clock edges CLKR(CRS) and coarse falling clock edge CLKF(CRS), which are provided to two fine adjustment circuits 412 and 414, respectively, each of which includes a phase detector and delay line. The timing reference for the fine adjustment circuit 412 is provided by the clock signal CLKIN$^+$. Thus, the fine adjustment circuit 412 is dedicated to adjusting the relative phase of the coarsely adjusted rising clock edges CLKR(CRS) based on a comparison between the feedback signal CLKFB$^+$ and the clock signal CLKIN$^+$. Similarly, the timing reference for the fine adjustment circuit 414 is provided by the clock signal CLKIN$^-$. Thus, the fine adjustment circuit 414 is dedicated to adjusting the relative phase of the coarsely adjusted falling clock edges CLKF(CRS) based on a comparison between the feedback signal CLKFB$^-$ and the clock signal CLKIN$^-$. In an exemplary embodiment, each of the delay elements in the delay lines of fine adjustment circuits 412 and 414 are approximately one-fourth the timing shift of the delay elements in the coarse adjustment circuit 408. For example, if the coarse delay elements each are 200 picoseconds in duration, then each fine delay element is approximately 50 picoseconds.

The finely adjusted rising edges CLKR(FINE) and the finely adjusted falling edges CLKF(FINE) are provided to a converter 416 which combines the edges for input to a clock driver circuit 418. The combined rising and falling edges result in the distorted output clock signal.

The clock driver circuit 418 drives the distorted clock output signal CLKOUT to the clock input of the data latch 208. The clock driver circuit 418 also provides a clock output signal to an I/O model circuit 420. As discussed previously, the I/O model 420 models the delays introduced by the input circuits (e.g., the receiver buffer 406) and output circuits (e.g., the data latch 208 and the data driver 206) such that the delay in the forward path of propagation of the reference clock signal XCLK is substantially equal to the delay in the feedback path. In addition, the I/O model 420 for the DLL 402 also models the behavior of the data latch 208 which causes the distortion of the data output signal DATA. Thus, for example, differences in slew rates of the p-channel and n-channel devices in the data latch 208 are appropriately modeled by the I/O model 420. In an exemplary embodiment, the I/O model 420 includes an actual copy of the data latch 208 which is configured to trigger on every rising and falling edge of the CLKOUT signal provided by the clock driver 418. Because the copy of the data latch 208 is manufactured concurrently with the actual data latch 208, any variations in processing parameters which could affect the behavior of the latch 208 also will affect the behavior of the copy of the latch in the I/O model 420.

The I/O model 420 thus generates a feedback signal having the appropriate input/output delays and which has been subjected to the behavior of the copy of the data latch 208. This signal is provided to a converter 422, which splits the feedback signal into the rising edge feedback signal CLKFB$^+$ and the falling edge feedback signal CLKFB$^-$. The feedback signal CLKFB$^+$ is provided to the fine adjustment circuit 412 for comparison with the clock signal CLKIN$^+$ to determine the appropriate timing adjustment for the coarsely adjusted rising edges CLKR(CRS). Similarly, the feedback signal CLKFB$^-$ is provided to the fine adjustment circuit 414 for comparison with the clock signal CLKIN$^-$ to determine the appropriate timing adjustment for the coarsely adjusted falling edges CLKF(CRS). As a result, the distorted clock output signal CLKOUT can be generated by the DLL 402 having both rising edges and falling edges shifted in a phase inverted manner to compensate for the distortion in the output data latch 208. When the distorted clock output signal CLKOUT provides the clock reference for the data latch 208, the data output signal DATA on data output bus 102 has substantially reduced, if any, duty cycle distortion.

In one exemplary application in which a reference clock having a 50% duty cycle has been employed, the inventors have observed duty cycle distortion in the data output signal of approximately 58%/42% (HIGH/LOW) if the duty cycle compensation scheme is not implemented. Use of the duty cycle distortion scheme has produced results in which distortion of the duty cycle of the data output signal has been substantially reduced. In the exemplary application, the inventors have observed compensation to the extent that output data duty cycles of 49.2%/50.8% (HIGH/LOW) have been achieved.

All of the delay line/phase detector circuits discussed above include appropriate comparison circuitry to compare the input signals, and appropriate shift circuitry to add or reduce delays in the signals, as is known in the art. Similarly, the clock driver circuits include appropriate drivers arranged in a manner (e.g., a tree-like configuration) to distribute the CLKOUT signal to one or more data output circuits that may be disposed at different physical locations on the substrate for an integrated circuit, as is known in the art. Further, the converters include appropriate conventional circuitry to convert the signals (e.g., split, combine, etc.) in the manners described above.

In the embodiments described above, duty cycle distortion has been discussed in relationship to a 50% duty cycle clock signal. It should be understood, however, that duty cycle distortion is meant to cover all cases in which the duty cycle of an output signal (e.g., the data output signal) is unintentionally different (i.e., distorted) relative to the duty cycle of a reference signal, such as the clock signal applied to a component which produces the output signal.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A memory device comprising:
a memory array configured to store data;
an output circuit operatively coupled to the memory array and configured to hold data accessed from the memory array in response to a read request and to generate a data output signal comprising the data accessed from the memory array; and
a delay lock loop operatively coupled to the output circuit and configured to receive a reference clock signal and to generate an output clock signal based on the reference clock signal, the delay lock loop comprising:
a synchronization circuit configured to generate the output clock signal by shifting a phase of the reference clock signal and adjusting a clock duty cycle of the reference clock signal to introduce a first distortion in a duty cycle of the output clock signal with respect to the reference clock signal, wherein the first distortion is phase-inverted with respect to a second distortion introduced by at least one component of the output circuit during operation such that, when the output clock signal is applied to the output circuit, the output clock signal compensates for output data duty cycle distortion.

2. The memory device as recited in claim 1, wherein the reference clock signal comprises falling edges and rising edges, and wherein the synchronization circuit comprises a first adjustment circuit configured to adjust timing of the falling edges, and a second adjustment circuit configured to adjust timing of the rising edges.

3. The memory device as recited in claim 2, wherein the synchronization circuit comprises a feedback circuit configured to provide a first feedback signal and a second feedback signal, wherein the first adjustment circuit adjusts the rising edges based on the first feedback signal, and the second adjustment circuit adjusts the falling edges based on the second feedback signal.

4. The memory device as recited in claim 3, wherein the feedback circuit comprises a model of the output circuit.

5. The memory device as recited in claim 4, wherein the output circuit comprises a latch.

6. The memory device as recited in claim 4, wherein the model comprises a copy of the output circuit.

7. The memory device as recited in claim 2, wherein the first adjustment circuit comprises a first delay line and a first phase detector, and wherein the second adjustment circuit comprises a second delay line and a second phase detector.

8. The memory device as recited in claim 1, wherein application of the output clock signal to the output circuit results in the data output signal having a duty cycle substantially equal to 50%.

9. The memory device as recited in claim 1, wherein the synchronization circuit comprises a feedback circuit to generate a feedback signal, and the synchronization circuit adjusts the clock duty cycle based on the feedback signal.

10. The memory device as recited in claim 9, wherein the feedback circuit comprises a model of the output circuit.

11. The memory device as recited in claim 9, wherein the feedback circuit comprises a copy of the output circuit.

12. The memory device as recited in claim 1, wherein the memory device comprises a synchronous dynamic random access memory.

13. The memory device of claim 1, wherein the output clock signal compensates for output data duty cycle distortion caused by the output circuit.

14. A memory device comprising:
a memory array; and
a delay lock loop coupled to the memory array and comprising:
an input configured to receive a reference clock signal having a reference duty cycle;
an output configured to couple an output clock signal to an output circuit, the output circuit configured to store data and to generate a data output signal; and
an adjustment circuit coupled between the input and the output, the adjustment circuit being configured to generate the output clock signal, the output clock signal being phase-shifted relative to the reference clock signal and having an output duty cycle different than the reference duty cycle, wherein the difference between the duty cycles of the output clock signal and the reference clock signal comprises a first distortion that is phase-inverted with respect to a second distortion introduced by the output circuit during operation such that, upon application of the output clock signal to the output circuit, the first distortion of the output clock signal compensates for output data duty cycle distortion otherwise resulting from the second distortion.

15. The memory device as recited in claim 14, wherein the reference clock signal comprises falling edges and rising edges, wherein the output clock signal comprises output falling edges and output rising edges, and wherein the adjustment circuit comprises:
a first adjustment circuit to adjust timing of the falling edges of the reference clock signal to generate the output falling edges of the output clock signal; and
a second adjustment circuit to adjust timing of the rising edges of the reference clock signal to generate the output rising edges of the output clock signal.

16. A memory device comprising:
a memory array; and
a delay lock loop coupled to the memory array and comprising:
an input configured to receive a reference clock signal having a reference duty cycle;
an output configured to couple an output clock signal to an output circuit, the output circuit configured to store data and to generate a data output signal comprising the stored data, the output circuit including at least one component that introduces a first distortion to a duty cycle of the output clock signal such that the data output signal has a different duty cycle than the output clock signal and
an adjustment circuit coupled between the input and the output, the adjustment circuit being configured to introduce a second distortion to the reference clock signal to generate the output clock signal, wherein the second distortion is phase-inverted with respect to the first distortion;

wherein, when the output clock signal is applied to the output circuit, the output circuit generates the data output signal, the data output signal having reduced duty cycle distortion with respect to the reference clock signal.

17. The memory device as recited in claim 16, wherein the at least one component comprises a data latch.

18. The memory device as recited in claim 16, comprising a feedback circuit coupled to the adjustment circuit, the adjustment circuit configured to adjust the reference duty cycle based on the feedback signal, wherein the feedback circuit comprises a model of the output circuit.

19. The memory device as recited in claim 18, wherein the model comprises a copy of the output circuit.

20. The memory device as recited in claim 16, wherein the reference clock signal comprises rising edges and falling edges, and wherein the adjustment circuit comprises a first adjustment circuit to adjust timing of the rising edges of the reference clock signal, and a second adjustment circuit to adjust timing of the falling edges of the reference clock signal.

* * * * *